(12) United States Patent
Moss et al.

(10) Patent No.: US 6,798,660 B2
(45) Date of Patent: Sep. 28, 2004

(54) LIQUID COOLING MODULE

(75) Inventors: David L. Moss, Austin, TX (US); Ty R. Schmitt, Round Rock, TX (US)

(73) Assignee: Dell Products L.P., Round Rock, TX (US)

(*) Notice: Subject to any disclaimer, the term of this patent is extended or adjusted under 35 U.S.C. 154(b) by 66 days.

(21) Appl. No.: 10/365,915

(22) Filed: Feb. 13, 2003

(65) Prior Publication Data

US 2004/0160741 A1 Aug. 19, 2004

(51) Int. Cl.[7] .................................................. H05K 7/20
(52) U.S. Cl. ..................... 361/699; 165/80.4; 174/15.1; 361/715
(58) Field of Search ................................ 62/3.7, 259.2; 165/80.4; 361/687–689, 694–699, 715, 700–702; 454/184

(56) References Cited

U.S. PATENT DOCUMENTS

| | | | |
|---|---|---|---|
| 5,131,233 A | 7/1992 | Cray et al. ..................... | 62/64 |
| 5,270,572 A | 12/1993 | Nakajima et al. ........... | 257/714 |
| 5,757,615 A | 5/1998 | Donahoe et al. ............ | 361/687 |
| 5,969,944 A | 10/1999 | Borkar et al. ............... | 361/699 |
| 5,978,228 A | 11/1999 | Borkar et al. ............... | 361/753 |
| 6,137,688 A | 10/2000 | Borkar et al. ............... | 261/753 |
| 6,196,003 B1 * | 3/2001 | Macias et al. ................ | 62/3.7 |
| 6,305,463 B1 | 10/2001 | Salmonson ................ | 165/80.3 |
| 6,407,916 B1 * | 6/2002 | Konstad ..................... | 361/687 |
| 6,462,943 B1 | 10/2002 | Borkar et al. ............... | 361/687 |
| 6,480,385 B2 | 11/2002 | Seshan ....................... | 361/704 |

OTHER PUBLICATIONS

T.Y. Tom Lee et al., "Compact Liquid Cooling System for Small, Moveable Electronic Equipment", IEEE Transactions on Components, Hybrids, and Manufacturing Technology, vol. 15. No. 5, Oct. 1992.

* cited by examiner

*Primary Examiner*—Gregory D. Thompson
(74) *Attorney, Agent, or Firm*—Baker Botts L.L.P.

(57) ABSTRACT

A liquid cooling module is disclosed. A module for providing a coolant to circulate within a computer system includes a housing, at least two connection ports and a coolant line. The housing may be formed and sized to fit within an auxiliary bay in the computer system. The connection ports may be formed in the housing of the module and couple to a cooling system. The coolant line may also be formed in the housing and connect with the connection ports for circulating the coolant such that the coolant receives heat generated by a computer device placed within the computer system.

28 Claims, 3 Drawing Sheets

LIQUID COOLING MODULE

TECHNICAL FIELD

This disclosure relates in general to the field of computers, and more particularly to a liquid cooling module.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As the consumer demand for smaller and denser information handling systems increases, manufacturers strive to integrate more computer systems into a smaller space. This integration has led to the development of several computer systems packaged in smaller configurations such as high density servers, which may include one or more microprocessors. Because more computer systems may be installed in the same amount of space, cooling systems for computer rooms must be able to handle the heat load of the additional computer systems.

A conventional cooling system may include a heating, ventilation and air-conditioning (HVAC) system, which circulates cool air to maintain a constant temperature throughout the computer room. Typically, the cooling efficiency of the HVAC system is dependent on the circulation of air through computer systems for removing the heat load created by the computer systems. Because the computer systems may be placed closer together in a denser configuration, the efficiency of the cooling system circulating the air may be reduced because the denser configuration allows less space for the air to circulate.

One attempt to increase the efficiency of a cooling system mounts the computer systems in a computer rack leaving open spaces between each system to allow for the circulation of air. The open spaces between each system provide adequate circulation to cool the computer system. The open space, however, reduces the number of systems that may be added to the computer rack. Thus, the benefit of having dense computer systems may be lost by the spacing requirement needed to provide adequate air circulation for cooling the computer systems.

In some instances, a heat load of additional computer systems may exceed the cooling capacity of the HVAC system. Thus, a liquid cooling system may be used to remove the additional heat load generated by the computer systems. The liquid cooling system circulates a coolant in a closed-loop system with connections to each computer system for removing heat from within the system.

In computer systems designed for liquid cooling, the connection ports are formed in the housing of the computer system. Most computer systems, however, are not designed for liquid cooling and the connection ports must be made in the housing. For example, the housing of the computer system can be removed and a connection port drilled in the housing to receive the connections from the liquid cooling system.

Adding the connection ports to the housing, however, may lead to problems within the computer system. First, determining a location on the housing to place the connection ports may be hard to find. Additionally, the connection ports may be placed near an existing device within the system, thus blocking access to the device.

Secondly, a coolant leak or other problem may develop at the connection ports or with the cooling system within the computer system. In some cases, the leak may cause the cooling system to lose efficiency. However, if the leak is significant, the coolant may damage computer components or the computer system.

SUMMARY

Thus, a need has arisen for a module to provide connection ports for liquid cooling.

A further need has arisen for retrofitting existing input/output (I/O) ports in a computer system with a module for liquid cooling.

A further need has arisen for a control system to detect a leak of the coolant from the liquid cooling system such as a leak detection system.

A further need has arisen for a control system to adjust the flow of coolant within the cooling system based on the temperature of the coolant.

In accordance with the teachings of the present invention, the disadvantages and problems associated with associating a liquid cooling system with a computer system have been substantially reduced or eliminated. In some embodiments of the present invention, a module for providing a coolant to circulate within a computer system includes a module housing, at least two connection ports and a coolant line. The housing may be formed and sized to fit within an auxiliary bay in the computer system. The connection ports may be formed in the housing of the module and couple to a cooling system. The coolant line may also be formed in the housing and connect with the connection ports for circulating the coolant such that the coolant receives heat generated by a computer device placed within the computer system.

In other embodiments, a computer system using a liquid cooling system to remove heat generated therein includes a processor, a heat exchanger, a module, and a cooling system. The heat exchanger may be thermally coupled to the processor to transfer heat to a coolant with the heat exchanger. The module is placed in an auxiliary bay of the computer system and includes a first connector port and a second connector port. The module may also be fluidly coupled to the heat exchanger via a first coolant hose and a second coolant hose. The first coolant hose is fluidly coupled at the first connector port and the second coolant hose fluidly couples at the second connector port such that the coolant circulates between the heat exchanger and the module. The cooling system may be associated with the computer system to supply coolant to the first connector port in the module and to remove coolant from the second connector port in the module, whereby the coolant circulates from the cooling system to the heat exchanger via the module.

In further embodiments, a method of installing a module to provide liquid cooling within a computer system includes placing the module in an auxiliary bay of the computer system. The method connects the module to a cooling system to circulate a coolant to the module. The method attaches a heat exchanger to at least one processor or other computer component within the computer system such that the heat exchanger is fluidly coupled to the module via coolant hoses. The method circulates the coolant from the module to the heat exchanger via the coolant hoses.

The present disclosure contains a number of important technical advantages. One technical advantage is a module to provide connection ports for liquid cooling of a computer system. Because the connection ports are part of the module, the connection ports may be designed and built as a complete unit. In addition, the module may include several attachment points for coolant hoses to couple to each connection port. The multiple attachment points may provide cooling to additional computer devices within the computer system as opposed to installing separate connection ports for additional devices.

Another technical advantage is retrofitting existing I/O ports in a computer system with a module for liquid cooling. Typically, a housing of a computer system does not include a space for installing connection ports. Placing the module in the existing I/O port of the computer system allows for liquid cooling of certain computer devices without the need to drill and install connector ports. Further the module may utilize the mounting locations of the I/O port such as a PCI mounting bracket. Thus, installation time may also be saved.

A further technical advantage is providing a control system to detect a leak of the coolant from the liquid cooling system such as a leak detection system. Because the coolant may be harmful to the electrical components of the computer system, the control system may incorporate a leak sensor to determine if a leak has occurred. In some embodiments, the control system connects to the I/O port for providing communications with the computer system that may cause the computer system to shutdown. The control system, however, may also cause the module to actuate valves to isolate the module to rest of the cooling system to prevent more coolant from leaking into the computer system.

A further technical advantage is providing a control system to adjust the flow of coolant within the cooling system based on the temperature of the coolant. Because the liquid cooling system removes a large quantity of heat from a computer system, the temperature of the coolant circulating within the coolant line may be monitored to adjust the flow of the coolant. For example, the flow rate of the coolant may be increased if the temperature of the coolant returning from a heat exchanger is above a set limit. Thus, the circulation of coolant may be regulated based on the coolant temperature.

All, some, or none of these technical advantages may be present in various embodiments of the present invention. Other technical advantages will be apparent to one skilled in the art from the following figures, descriptions, and claims.

BRIEF DESCRIPTION OF THE DRAWINGS

A more complete understanding of the embodiments of the present disclosure and advantages thereof may be acquired by referring to the following description taken in conjunction with the accompanying drawings, in which like reference numbers indicate like features, and wherein.

DETAILED DESCRIPTION

Preferred embodiments of the present disclosure and their advantages are best understood by reference to FIGS. 1 through 5, where like numbers are used to indicate like and corresponding parts.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices, as well as various input and output (I/O) devices, such as a keyboard, a mouse, and a video display. The information handling system may also include one or more buses operable to transmit communications between the various hardware components.

Figure 1:
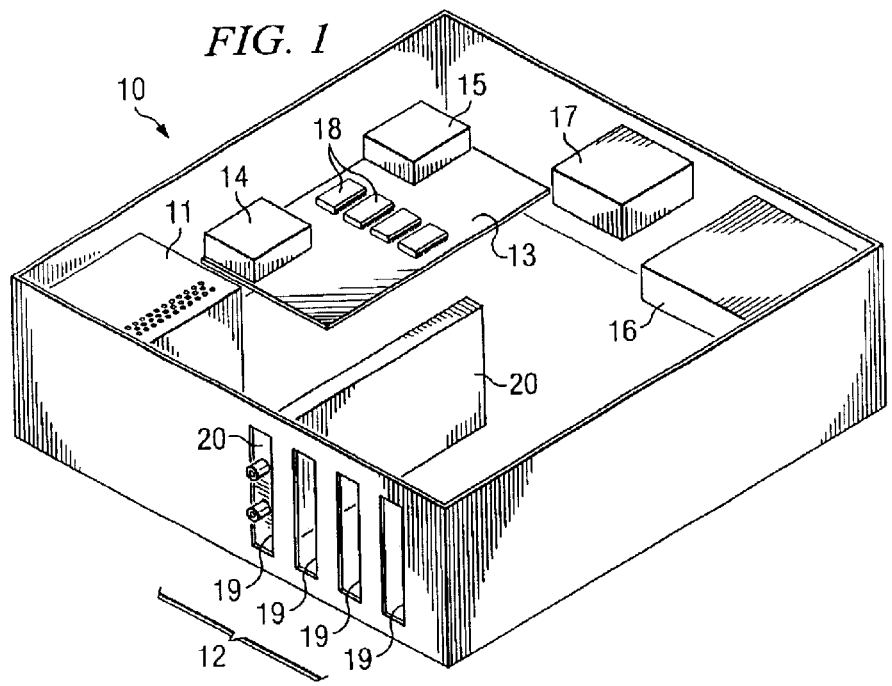
FIG. 1 illustrates a perspective view of a computer system according an example embodiment of the present disclosure.

FIG. 1 illustrates a perspective view of computer system 10. Computer system 10 may be a type of information handling system, which includes module 20 placed in auxiliary bay 12. In certain embodiments, computer system 10 may be a rack mounted computer system such as a server that is mounted in a rack enclosure with other computer systems.

Computer system 10 may include computer devices such as power supply 11, memory 18 placed on motherboard 13, media device 16 (e.g., hard disk drives), and media drive 17 such as an optical drive. Another computer device in computer system 10 includes one or more microprocessors or central processing units (CPUs), commonly referred to as processor 14, that is used to provide computing resources. In some computer systems, a computer device may further include co-processor 15, which provides additional computing resources within computer system 10. Since processor 14 and co-processor 15 may generate considerable amounts of heat, module 20 may be placed in auxiliary bay 12 of computer system 10 to remove the heat.

Auxiliary bay 12 formed in computer system 10 may include one or more input/output (I/O) ports 19. I/O ports 19, typically, are arranged to align with a printed circuit board such as motherboard 13 within computer system 10. The printed circuit board may receive one or more computer components such as a peripheral component interface (PCI) card inserted into I/O port 19. In some embodiments, auxiliary bay 12 includes a plurality of I/O ports 19 to provide access for attaching a computer device at each I/O port 19. For example, a first I/O port may contain a network card that allows for computer system 10 to communicate with other computer systems via a network.

Typically, computer system 10 includes one or more I/O ports 19 that are not populated with a computer device. Thus, module 20 may be placed into one of the unpopulated spaces in auxiliary bay 20. As such, module 20 may be designed and sized to fit into one or more I/O port 19 of auxiliary bay 20. Once module 20 is placed in computer system 10, cooling system 30 may connect to module 20 via first connection port 22 and second connection port 23, as described below.

Figure 2:
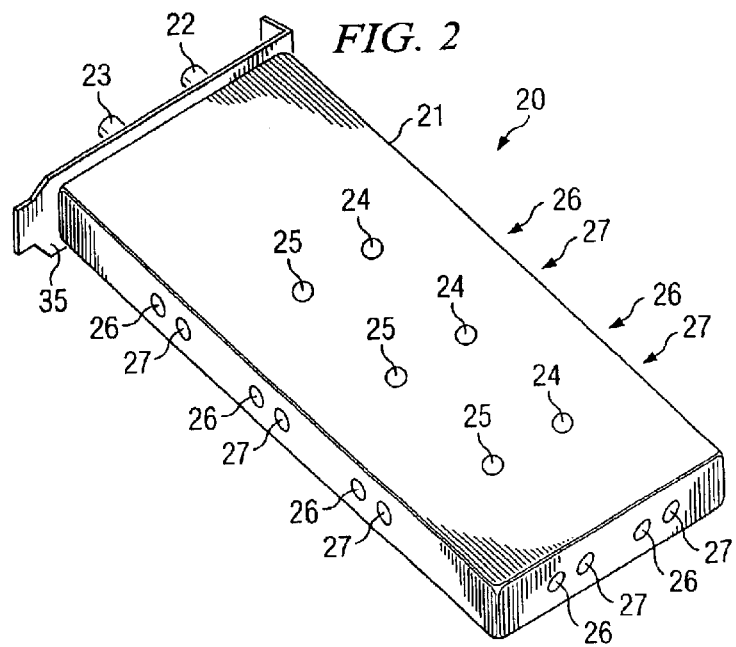
FIG. 2 illustrates a perspective view of an example embodiment of a module designed to fit in an auxiliary bay of the computer system according to the present disclosure.

FIG. 2 illustrates a perspective view of an example embodiment of module 20 designed to fit in auxiliary bay 12 of computer system 10. Module 20 may include housing 21, first connector port 22, second connector port 23, and a plurality of hose ports.

Housing 21 may be sized and shaped to fit the dimensions of auxiliary bay 12. In certain example embodiments, housing 21 is shaped to represent the size of a PCI card and may use the PCI card mounting location. For example, housing 21 may further include PCI flange 35, which may be shaped to couple module 20 to computer system 10 at the PCI mounting location.

Housing 21 of module 20 may further be designed to include a clam-shell design. The clam-shell design may be incorporated to provided multiple locations for hose egresses for attaching hoses to processor 14 within computer system 10. Additionally, the clam-shell design may be used for design purposes to provide access to the interior compartment of module 20.

Because module 20 is placed inside of computer system 10, housing 21 may contact electrical sources, which may pose a danger of electrical shock. Thus, housing 21 may be insulated from conducting electricity. In some embodiments, housing 21 may be formed from a nonconducting material.

Module 20 may also include a first connector port 22 and a second connector port 23. First connector port 22 and a second connector port 23 may be used to attach module 20 to cooling system 30, as described below. In some embodiments, first connector port 22 and a second connector port 23 may be a quick connect fitting mounted on PCI flange 35 to provide access into housing 21. The quick connect fittings may provide a water-tight seal when connecting to cooling system 30 to prevent a leak.

Module 20 may include a plurality of hose ports for attaching module 20 to individual computer devices within computer system 10. Hose ports may include first side port 24 and second side port 25 connected to a first side of housing 21, and first edge port 26 and second edge port 27 connected to a first edge of housing 21. Depending on the location of the computer component that will be cooled with the liquid cooling system, a user may attached hoses via first side port 24, second side port 25, first edge port 26 or second edge port 27. Typically, hoses are connected in series to different computer components through module 20. However, in some instances, the computer components may be connected in parallel.

Figure 3:
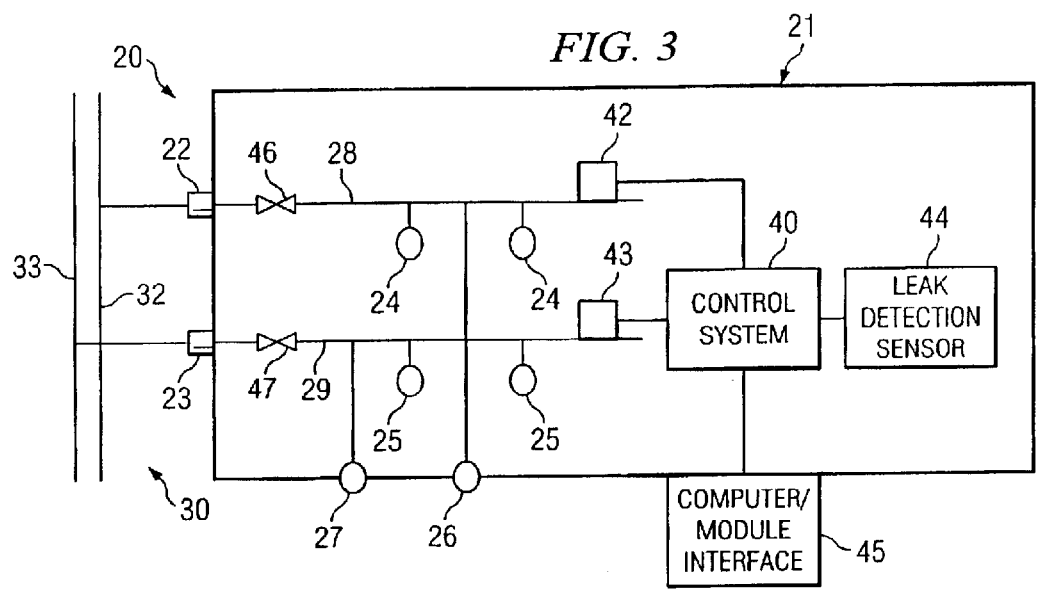
FIG. 3 is a schematic view of a module including a control system connected to a cooling system according to an example embodiment of the present disclosure.

FIG. 3 is a schematic view of cooling system 30 connected to module 20, which includes control system 40. Module 20 may include first coolant line 28 and second coolant line 29, which may receive a coolant from cooling system 30 via first system line 32 and second system line 33. First coolant line 28 may receive the coolant from first system line 32 through a connection at first connector 22. Similarly, second coolant line 29 may receive or may transfer the coolant to second system line 33 through second connector 23. Typically, first system line 32 provides the coolant from cooling system 30 at a cooler temperature than the coolant being received at second coolant line 33. Hence, first coolant line may provide a cool coolant and second coolant line may receive the hot or heated coolant after being passed through module 20.

The coolant from coolant system 30 is used to remove heat from the computer device. Typically, the coolant is a fluid having the ability to absorb heat. For example, a coolant may be mixture of water and glycol, such as ethylene glycol or propylene glycol.

Control system 40 is an electrical device placed within module 20 for monitoring the coolant flowing through first coolant line 28 and second coolant line 29. Control system 40 may include first sensor 42 and second sensor 43, first valve 46 and second valve 47, leak detection sensor 44, and/or computer module interface 45 to monitor the circulation of the coolant for a variation from a normal operating condition. For example, if a leak is detected by leak detection sensor 44, then control system would detect a variation from a normal operating condition.

In some embodiments, first sensor 42 and second sensor 43 may be coupled to first coolant line 28 and second coolant line 29, respectively. First sensor 42 and second sensor 43 may be used to monitor the temperature of the coolant within first coolant line 28 and second coolant line 29. By monitoring the temperature of the coolant, control system 40 may determine whether or not module 20 is functioning within normal operating conditions. If a variation is detected, control system 40 may alert a user to the variation or cause computer system 10 to shut-down.

In another embodiment, first sensor 42 and second sensor 43 may be pressure sensors connected to first coolant line 28 and second coolant line 29, respectively. Control system 40 may monitor the pressure of first coolant line 28 and second coolant line 29 to determine whether or not module 20 is functioning within normal operating conditions. For example, if the pressure in first coolant line 28 increases, then control system 40 may determine that the coolant is blocked somewhere upstream of first sensor 42. Thus, control system 40 may alert a user to the variance or cause computer system 10 to shut-down.

Leak detection sensor 44 may be placed within housing 21 to monitor first coolant line 28 and second coolant line 29 for a possible leak within housing 21. Typically, leak detection sensor 44 may be placed in a bottom corner where the coolant will pool if a leak should occur. In certain embodiments, leak detection sensors 44 may include a sensor that detects the presence of the coolant within housing 21.

Computer/module interface 45 may be connected to control system 40 in order to provide communications to computer system 10. Because module 20 is placed in the space of I/O port 19, module 20 may connect to computer system 10 via computer/module interface 45. Thus, a user or a computer program may be used to monitor the operation conditions of module 20. In some embodiments, computer/module interface 45 may be used to send control signals between computer system 10 and module 20 to vary the flow of coolant.

First valve 46 and second valve 47 may be coupled to first coolant line 28 and second coolant line 29, respectively, and may be in communication with control system 40. Because control system 40 is monitoring the circulation of the coolant within module 20, control system 40 may regulate the circulation of the coolant. In one example embodiment, control system 40 may regulate or adjust the flow of the coolant by throttling first valve 46 and second valve 47 such that either valve may be partially opened or closed to modify the circulation of the coolant.

Additionally, first valve 46 and second valve 47 may be used to isolate or block off module 20 in the event of a leak. Because control system 40 is monitoring the circulation of the coolant within module 20, control system 40 may alert a user to a potential variance or problem developing within module 20. For example, control system 40 may determine that a leak is present within housing 21 and cause first valve 46 and second valve 47 to block off first coolant line 28 and second coolant line 29. By blocking first valve 46 and second valve 47, the flow of coolant will be contained and limited to the amount coolant present within module 21. In certain embodiments, control system 40 may send a signal through computer/module interface 45 to cause the shutdown of computer system 10.

Figure 4:
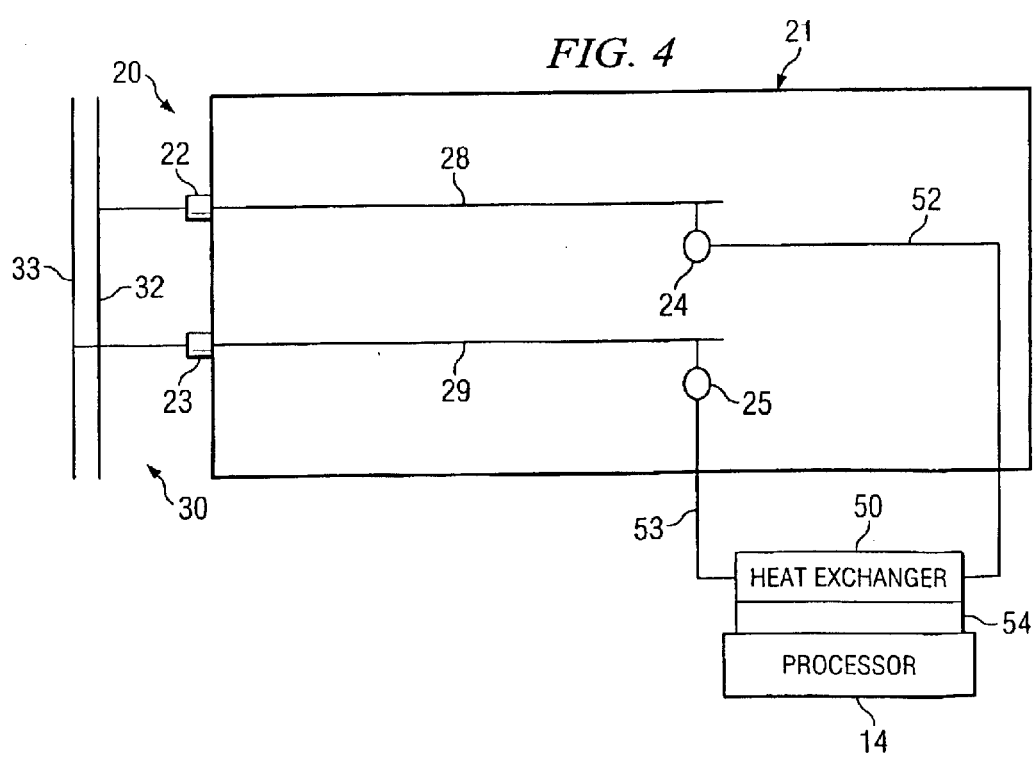
FIG. 4 is a schematic view of a module connected to a cooling system used to remove heat from a processor according to an example embodiment of the present disclosure.

FIG. 4 is a schematic view of module 20 connected to cooling system 30 used to remove heat from processor 14. Module 20 may couple to cooling system 30 via first connector port 22 and second connector port 23 at first system line 32 and at second system line 33. Module 20 may connect to computer system 10 via first hose 52 and second hose 53 to supply a coolant to heat exchanger 50 for removing heat from processor 14 or any other computer device or multiple computer devices with computer system 10.

First hose 52 may couple to first side port 24, or first edge port 26, to supply coolant to a first end of heat exchanger 50. Typically, a coolant is supplied from cooling system 30 through first system line 32 via first coolant line 28 to first hose 52 and into heat exchanger 50. Second hose 53 may carry the coolant back to module 20 from heat exchanger 50 after the coolant has passed through heat exchanger 50. While passing through heat exchanger 50, the coolant may remove heat generated by the computer device such as processor 14.

Following the pass through heat exchanger 50, the coolant returns to module 20 via second coolant line 29 entering through either second side port 25 or second edge port 27. Typically, the coolant returning to second coolant line 29 has removed heat from processor 14 as it passed through heat exchanger 50. The heated coolant may be returned to cooling system 30 via second connector port 23 and into second system line 33, The heat removed by the coolant may be transported away from computer system 10, where cooling system 30 discharges the heat from the coolant after which it may re-circulate the coolant back to module 20 via first system line 32.

Heat exchanger 50 may couple to processor 14 or any other computer device to remove heat generated therein. Heat exchanger 50 may be any variety or style of heat exchanger and may include microchannels for the coolant to circulate from first hose 52 to second hose 53.

To aid in the removal of heat from processor 14, heat exchanger 50 may utilize thermal interface 54 to remove or transfer heat from processor 14 or any other computer device to the coolant within heat exchanger 50. Thermal interface 54 may include a heat transfer material applied between heat exchanger 50 and the computer device and may include any other suitable material to transfer heat.

Figure 5:
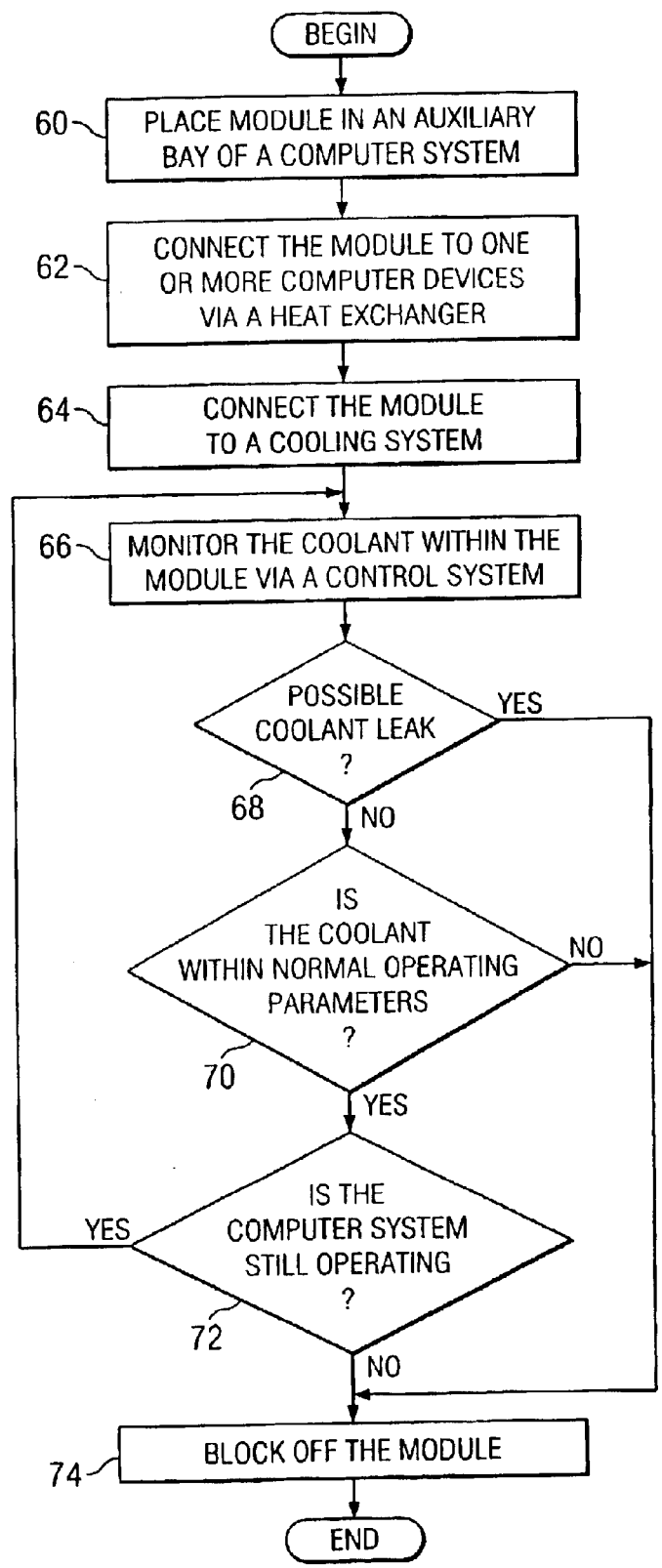
FIG. 5 illustrates a flow chart for removing heat from a computer system using a module according to an example embodiment of the present disclosure.

FIG. 5 illustrates a flow chart for removing heat from computer system 10 using module 20. At step 60, module 20 may be placed in auxiliary bay 12 of computer system 10. In some embodiments, module 20 may be connected to auxiliary bay 20 utilizing PCI flange 35.

At step 62, module 20 may be connected to heat exchanger 50 via first hose 52 and second hose 53. Typically, heat exchanger 50 is thermally coupled to a computer device such as processor 14. Heat exchanger 50 include several internal channels, which cause the coolant to make multiple passes over the computer device. In some embodiments, the coolant enters heat exchanger 50 via first hose 52 and is returned to module 20 via second hose 53.

At step 64, module 20 may be connected to cooling system 30 via first connector port 22 and second connector port 23. Typically, cooling system 30 supplies a coolant at a lower temperature via first system line 32 to module 20 and receives the coolant via second system line 33 from module 20. The coolant may be circulated to a heat removal process such as a refrigeration system and returned to first system 32 in a closed loop system.

At step 66, the coolant is monitored within module 20 via control system 40. In some embodiments, control system 40 is placed within module 20. Control system 40, however, may also include information received from computer system 10 via computer/module interface 45.

At step 68, control system 40 monitors the coolant for a possible leak within module 20. In some embodiments, leak detection sensor 44 may be communicatively coupled to control system 40 and used to determine whether or not the coolant is leaking within module 20. If the coolant is leaking within module 20, control system 40 may block off module 20 by closing first valve 46 and second valve 47, at step 74. Alternatively, control system 40 may cause a shutdown of the computer system 10.

Following the determination that coolant is not leaking, control system 40 monitors the coolant to determine whether or not the coolant is within normal operating parameters, at step 70. In some embodiments, normal operating parameters may include a pressure differential between first coolant line 28 and second coolant line 29. Alternatively, a normal operating parameter may include a temperature difference between first coolant line 28 and second coolant line 29. If the coolant is not within normal operating parameters, control system 40 may block off module 20 by closing first valve 46 and second valve 47, at step 74. Alternatively, control system 40 may cause a shutdown of the computer system 10.

If the coolant is operating within normal operating parameters, control system 40 may communicate with computer system 10 to determine whether or not computer system 10 is still operating, at step 72. If computer system 10 is still operating, control system 40 may return to step 66 and continue to monitor the coolant within module 40. However, if computer system 10 has been shut-down, control system 10 may proceed to block off module 20, at step 74.

Although the present disclosure has been described with respect to a specific embodiment, various changes and modifications will be readily apparent to one skilled in the art. The present disclosure is not limited to the illustrated embodiment, but encompasses such changes and modifications that fall within the scope of the appended claims.

What is claimed is:

1. A module for providing a coolant to circulate within a computer system, comprising:
    a housing formed and sized to fit within an auxiliary bay in the computer system;
    at least two connector ports formed in the housing, the at least two connector ports operable to couple to a cooling system; and
    a coolant line formed within the housing, the coolant line operable to connect with the at least two connector ports for circulating a coolant, wherein the coolant receives heat generated by a computer device placed within the computer system.

2. The module of claim 1 wherein the coolant comprises water and glycol.

3. The module of claim 1 further comprising a plurality of connection ports formed in the housing, the plurality of connection ports operable to attach one or more coolant hoses to the coolant line for circulating the coolant to the computer device placed within the computer system.

4. The module of claim 1 further comprising a control system associated with the coolant line, the control system operable to monitor the circulation of the coolant in the coolant line.

5. The module of claim 4 further comprising at least one temperature sensor associated with the control system, the at least one temperature sensor operable to monitor a temperature of the coolant in the coolant line.

6. The module of claim 4 further comprising at least one pressure sensor associated with the control system, the at least one pressure sensor operable to monitor a pressure of the coolant within the coolant line.

7. The module of claim 4 further comprising a leak detection sensor associated with the control system, the leak detection sensor operable to determine that the coolant is leaking within the coolant line.

8. The module of claim 4 further comprising a computer/module interface electrically coupled between the module and the computer system, the computer/module interface operable to provide communications between the control system and the computer system.

9. The module of claim 4 further comprising at least one valve associated with the control system, the at least one valve operable to stop the flow of coolant through the coolant line.

10. The module of claim 1 wherein the at least two connector ports comprise quick-connect fittings.

11. The module of claim 1 further comprising the housing including a clam-shell design.

12. The module of claim 1 further comprising the housing formed in part from a non-conductive material.

13. The module of claim 1 wherein the computer device comprises a device selected from the group consisting of a processor, a co-processor, a memory, a media device, an optical device, a hard drive, a video card, a network card, an audio card, and a power supply.

14. A computer system using a liquid cooling system to remove heat generated therein, the computer system comprising:

at least one processor;

a heat exchanger thermally coupled to the processor, the heat exchanger operable to transfer heat generated by the at least one processor to a coolant within the heat exchanger;

a module placed in an auxiliary bay of the computer system, the module including a first connector port and a second connector port;

the module fluidly coupled to the heat exchanger via a first coolant hose and a second coolant hose, wherein tile first coolant hose fluidly couples to the first connector port and the second coolant hose fluidly couples to the second connector port such that the coolant circulates between the heat exchanger and the module; and a cooling system associated with the computer system, the cooling system operable to supply coolant to the first connector port in the module and to remove coolant from the second connector port in the module, whereby the coolant circulates from the cooling system to the heat exchanger via the module.

15. The computer system of claim 14 wherein the auxiliary bay comprises an input/output port in the computer system.

16. The computer system of claim 14 further comprising a control system coupled to the module, the control system operable to monitor the circulation of the coolant.

17. The computer system of claim 14 further comprising a leak detection system associated with the module, the leak detection system operable to determine that the coolant is leaking.

18. The computer system of claim 14 further comprising a thermal interface disposed between the heat exchanger and the at least one processor, the thermal paste operable to aid in the removal of heat from the at least one processor.

19. A method of installing a module to provide liquid cooling within a computer system, the method comprising:

placing the module in an auxiliary bay of the computer system;

connecting the module to a cooling system, the cooling system operable to circulate a coolant to the module;

attaching a heat exchanger to at least one processor within the computer system, the heat exchanger fluidly coupled to the module via coolant hoses; and circulating the coolant from the module to the heat exchanger via the coolant hoses.

20. The method of claim 19 further comprising monitoring the circulation of the coolant for a variation from a normal operating condition.

21. The method of claim 20 further comprising, in response to monitoring the circulation of the coolant for the variation from the normal operating condition, automatically sending a notification to a user of the computer system.

22. The method of claim 19 further comprising monitoring the circulation of the coolant to detect a coolant leak.

23. The method of claim 22 further comprising, in response to the detecting the coolant leak, automatically closing a valve to isolate the module from the cooling system.

24. The method of claim 22 further comprising, in response to the detecting the coolant leak, automatically causing the computer system to shutdown.

25. The method of claim 19 further comprising monitoring a temperature differential between a first coolant line and a second coolant line.

26. The method of claim 25 further comprising, in response to monitoring the temperature differential, adjusting the circulation of the coolant through the heat exchanger.

27. The method of claim 19 further comprising monitoring a pressure differential between a first coolant line and a second coolant line to detect a pressure drop.

28. The method of claim 27 further comprising, in response to the detecting the pressure drop, automatically causing the computer system to shutdown.

* * * * *